(12) United States Patent
Kono et al.

(10) Patent No.: US 6,346,678 B1
(45) Date of Patent: Feb. 12, 2002

(54) CIRCUIT BOARD AND METHOD OF MANUFACTURING A CIRCUIT BOARD

(75) Inventors: Hiroshi Kono; Masaaki Matsushima, both of Yokohama; Yasushi Taniguchi, Kawasaki, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/229,441

(22) Filed: Jan. 13, 1999

(30) Foreign Application Priority Data

Jan. 14, 1998 (JP) .......................................... 10-005593
Jan. 5, 1999 (JP) .......................................... 11-000282

(51) Int. Cl.⁷ ................................................ H05K 1/03
(52) U.S. Cl. ...................................... 174/255; 174/262
(58) Field of Search ................................ 174/255, 262, 174/263, 264, 265, 266; 361/792, 793, 794, 795

(56) References Cited

U.S. PATENT DOCUMENTS 6,071,597 A * 6/2000 Yang et al. .................. 428/209
6,132,853 A * 10/2000 Noddin ....................... 428/209

FOREIGN PATENT DOCUMENTS

| JP | 136650 | 6/1993 |
| JP | 152744 | 6/1993 |
| JP | 152748 | 6/1993 |

* cited by examiner

*Primary Examiner*—Jeffrey Gaffin
*Assistant Examiner*—Jeremy Norris
(74) *Attorney, Agent, or Firm*—Fitzpatrick, Cella, Harper & Scinto

(57) ABSTRACT

A printed circuit board is free from any residue of the carbide of resin produced on the surface of its copper foil exposed after boring a blind hole by means of a laser beam. Such a printed circuit board is adapted to have a blind hole 10 bored through an insulator 1 until the hole gets to the copper foil 3 arranged under the insulator by irradiating the insulator 1 with a laser beam. A laser beam absorbing region is provided between said insulator 1 and said copper foil 3.

8 Claims, 11 Drawing Sheets

CIRCUIT BOARD AND METHOD OF MANUFACTURING A CIRCUIT BOARD

BACKGROUND OF THE INVENTION

1. Field of the Invention

This invention relates to a circuit board and also to a method of manufacturing a circuit board. More particularly, it relates to a circuit board adapted to connect one or more than one BGA (ball grid array) packages and also to a method of manufacturing such a circuit board.

2. Related Background Art

FIG. 1 of the accompanying drawings schematically illustrates in cross section only part of a multilayer printed circuit board prepared by coating the surfaces of stacked insulators 1 that operate as supports with copper foils 2, which are electric conductors. Referring to FIG. 1, the insulators 1 of the multilayer printed circuit board are typically produced by impregnating woven glass fiber networks with epoxy resin and then hardening them. Note that, in FIG. 1, another copper foil 3 is sandwiched by the insulators 1, or the supports, to operate as internal conductor.

For electrically connecting one of the external copper foils 2 and the internal copper foil 3 of a printed circuit board having a configuration as described above by a known technique, a hole is bored through the internal copper foil 3 from the surface of the printed substrate where the selected external copper foil 2 is located and the wall surface of the hole is plated with copper to form an electroconductive layer 4 as shown in FIG. 2.

However, with such a known technique of boring a hole by means of a drill and forming an electroconductive layer 4, the internal copper foil 3 only minimally contacts the electroconductive layer 4 along the periphery of the hole bored through the internal copper foil 3 so that the electric connection can often be unreliable.

FIG. 3 is a known process proposed to bypass the above identified problem. In FIG. 3, a blind hole is bored, leaving the internal copper foil 3 intact, and an electroconductive layer 4 is formed on the wall surface of the blind hole. Such a blind hole is typically bored by means of a laser beam, using carbon dioxide laser. A blind hole may alternatively be bored in a manner as described below by means of a photolithographic technique. Referring to FIG. 4, photoresist 41 is applied to the surface of the copper foil 2, exposed to light and then photochemically developed for forming a hole 5 through the photoresist 41 by patterning. The exposed portion of the copper foil 2 is then removed by etching to form a hole in the copper foil and, as shown in FIG. 5, a laser beam 6 is made to irradiate the hole 5 bored through the copper foil in alignment with the hole of the photoresist to produce a blind hole through the insulator 1 by removing the glass fiber and the epoxy resin of the insulator 1 and expose the internal copper foil 3.

In the case of a printed circuit board prepared by applying an insulation layer 7 on a copper foil 2 as shown in FIG. 6, a fine hole is bored through the insulation layer 7 and an electric conductor such as solder is inserted (or introduced) into the bored hole to electrically connect the copper foil 2 with a component arranged on the insulation layer 7. Such a fine hole can be produced by etching the insulation layer 7, which is typically made of a photosensitive resin material.

However, with the trend in recent years of extremely exploiting printed circuit boards, even smaller blind holes are required to be formed with a higher degree of precision such that any currently available photolithographic techniques cannot cope with. A proposed alternative technique is the use of a laser beam which is typically a beam of carbon dioxide laser for boring a blind hole. Referring to FIG. 7, showing such a blind hole boring technique, a laser beam 6 is converged and made to directly hit the top insulation layer and produce a blind hole by removing the resin of the insulation layer 7 until the underlying copper foil 2 is exposed.

However, when a blind hole is bored by means of a laser beam of carbon dioxide laser, while the laser beam 6 striking the printed circuit board is reflected by the copper foil 2 or 3 and hence the copper foil 2 under the insulation layer 7 or the internal copper foil 3 remains intact, the resin of the insulation layer 7 or that of the insulator 1 can be carbonized to produce a carbonized layer on the copper foil 2 or on the internal copper foil 3 so that consequently the contact area of the conductors can be reduced and the formation of an electroconductive layer on the wall surface of the bored blind hole, can give rise to a defective plating and/or a poorly reliable electric contact.

Meanwhile, BGA (ball grid array) packages have become commercially available as LSI packages that can meet the requirement of a higher degree of integration and a higher operating speed imposed on LSI devices. FIG. 8 is a schematic cross sectional view of a popular BGA package, which is an OMPAC (over molded pad array carrier) type BGA package. Ball-shaped solder bumps 90 are arranged on the rear surface of substrate 81, while a semiconductor chip 86 is mounted on the front surface of the substrate 81 and connected by wire bonding to the wiring conductors 82, 84 and 85 arranged on the substrate 81 by way of Au wires 87. The semiconductor chip and the wire bonding section arranged on the upper surface of the substrate 81 are molded only at a single side by resin 89. An insulating resin layer 83, which is generally a solder resist layer, is formed between the solder bumps or between the wiring circuits. Such a BGA package is structurally simple and affords a wide ball pitch as solder bumps are arranged on the rear surface of the substrate so that components can be mounted on the substrate without difficulty to allow a high density mounting. Note that the wiring conductors 82, 84 and 85 in FIG. 8 may be used as a signal wire, a power wire and a grounding wire respectively.

On the other hand, FIG. 9 shows a multilayer printed circuit board prepared by a build-up technique and comprising a core substrate 91 made of an organic material. A first circuit pattern 92, a first insulation layer 93, a second circuit pattern 94, a second insulation layer 95, a third circuit pattern 96, a third insulation layer 97 and a fourth circuit pattern 98 are sequentially laid on the core substrate 91 in the above mentioned order. The first circuit pattern and the second circuit pattern on the core substrate are connected with each other by way of a first via hole 100 bored through the first insulation layer and the second circuit pattern and the third circuit pattern are connected with each other by way of a second via hole 101 bored through the second insulation layer, whereas the third circuit pattern and the fourth circuit pattern are connected with each other by way of a third via hole 102 bored through the third insulation layer. The first through third insulation layers are formed by using a photosensitive organic resin material. The first through third via holes are bored by means of a photolithographic technique and selective etching. Subsequently, the lateral walls of the via holes are plated.

BGA package substrates and the multilayer circuit boards as described above are also facing the requirement of reducing the diameter of the openings of the solder resist and that of reducing the diameter of the via holes for connecting layers respectively in order to enhance the wiring density and the wire accommodating capacity of the substrate. In an attempt to meet these requirements, the use of laser beams has also been proposed to replace the popular photovia technique that is based on photolithography. While $CO_2$ laser, excimer laser and UV laser such as third harmonic of YAG are currently used, $CO_2$ laser is most popular as it provides a satisfactorily high processing speed.

However, again, when removing an organic resin insulator material by means of laser, debris of the organic resin material and/or a carbide thereof produced on the circuit patterns of lower layers would not be removed completely and remain as residue. Then, the wall surface of the bored hole would not be perfectly plated under such conditions. Thus, there arises the need of carrying out a desmearing process or a plasma processing operation in order to remove the residues of the organic resin material.

SUMMARY OF THE INVENTION

In view of the above described circumstances, the present invention is intended to provide a printed circuit board that is free from the above identified problems and that does not carry any residue of the carbide of resin produced on the surface of the copper foil exposed after boring a blind hole by means of a laser beam.

Accordingly, it is an object of the present invention to provide a highly reliable circuit board that is free from any unnecessary residue left on the surface of one or more than one copper foils thereof that can obstruct electric connection and a method of manufacturing such a substrate.

It is another object of the present invention to provide a circuit board comprising an insulator arranged on a conductor and adapted to be used after exposing the conductor under the insulator by irradiating a laser beam on the insulator, wherein a laser beam absorbing region is provided between the conductor and the insulator.

It is still another object of the present invention to provide a method of manufacturing a circuit board comprising steps of preparing a substrate having an insulator on a conductor, irradiating the insulator with a laser beam and removing the insulator at the area irradiated by the laser beam to expose the surface of the conductor, wherein a laser beam absorbing region is provided between the conductor and the insulator and the laser irradiation step is conducted so as to irradiate at least the laser absorbing region with the laser beam.

Still another object of the present invention is to provide a method of manufacturing a circuit board adapted to be used for connecting one or more than one BGA packages or as a multilayer circuit board prepared by a build-up technique and forming a solder resist pattern or one or more than one viaholes in an insulation layer thereof for interlayer connection by means of laser, wherein the surface of the copper circuit pattern provided under the solder resist or the interlayer insulation layer is subjected to a blackening process.

Still another object of the present invention is to provide a circuit board comprising a copper foil partly removed in advance at spots corresponding to one or more than one given openings for boring blind holes getting to the copper foil under the openings through an insulator by irradiating a laser beam, wherein a thin film apt to be decomposed by absorbing a laser beam is provided between said insulator and said copper foil.

A further object of the present invention is to provide a circuit board comprising a copper foil of circuits having on the surface an insulation layer applied thereto and adapted to produce one or more than one blind holes getting to the copper foil under the insulation layer by irradiating the substrate with a laser beam and partly removing the insulation layer, wherein a thin film apt to be decomposed by absorbing a laser beam is provided on the copper foil of circuits.

DESCRIPTION OF THE PREFERRED EMBODIMENTS

This invention realizes on the surface of a metal conductor circuit pattern a state free from residual debris of organic resin materials and carbide thereof by providing a laser beam absorbing region at least on the surface of the metal conductor circuit pattern located under the organic insulator to be removed by a laser beam irradiating process in order to improve the yield of the subsequent plating process. Thus, the present invention provides a method of manufacturing highly reliable high density printed circuit boards, BGA circuit boards and multilayer circuit boards prepared by means of a build-up technique at a high yield.

More specifically, a thin metal film apt to be decomposed by absorbing a laser beam is provided between an insulation layer or an insulator and an electroconductive copper foil and the insulation layer or the insulator and the thin metal film are removed simultaneously to expose the surface of the copper foil having no carbide adhering to it.

Alternatively, according to the invention, in the process of forming a solder resist pattern or one or more than one viaholes for interlayer connection by irradiation of a laser beam in a circuit board adapted to be used for connecting one or more than one BGA packages or as a multilayer circuit board prepared by means of a build-up technique and plating the openings for electric connection, the surface of the copper circuits located under the organic insulator to be removed by the laser beam irradiation is blackened in advance. As a result, the surface of the copper circuit is made free from undesired objects including residual debris of organic resin materials such as solder resist and amorphous carbon that can be produced by the laser beam irradiation and hence a highly reliable electric connection will be realized by the subsequent plating operation.

Now, the present invention will be described in greater detail by referring to the accompanying drawings.

Figure 1:
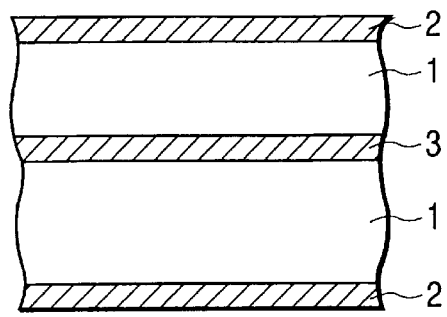
FIGS. 1, 2 and 3 are schematic cross sectional views of circuit boards.
Figure 2:
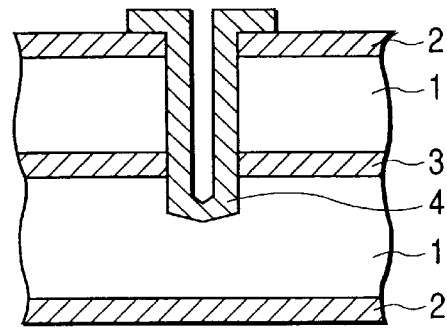
Figure 3:
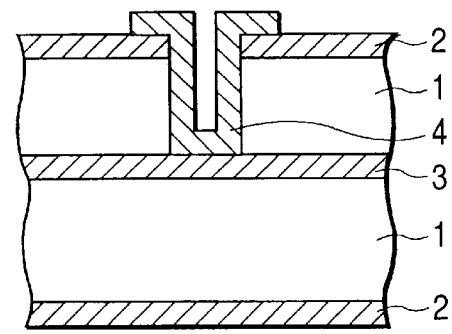
Figure 4:
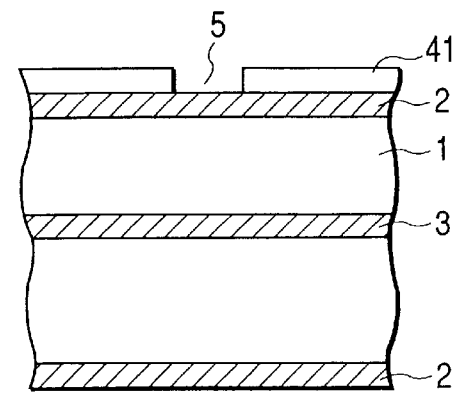
FIGS. 4 and 5 illustrate how the blind hole of FIG. 3 is formed.
Figure 5:
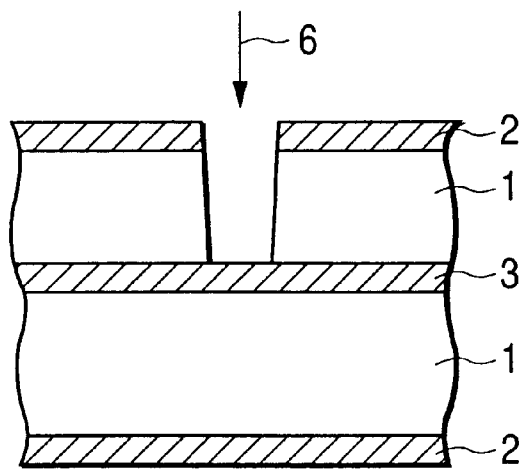
Figure 6:
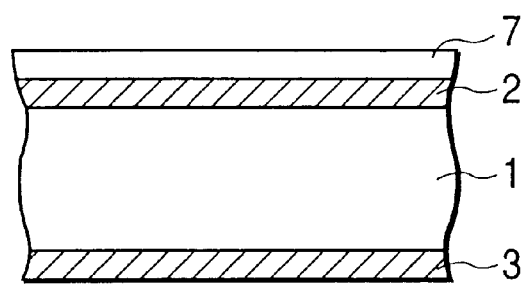
FIGS. 6 and 7 are schematic cross sectional views of a different type of circuit board, illustrating how blind holes are bored.
Figure 7:
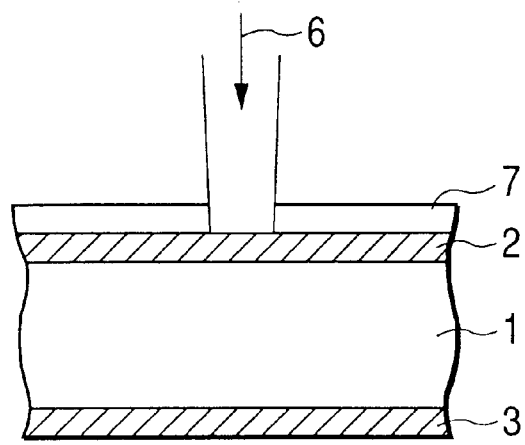
Figure 8:
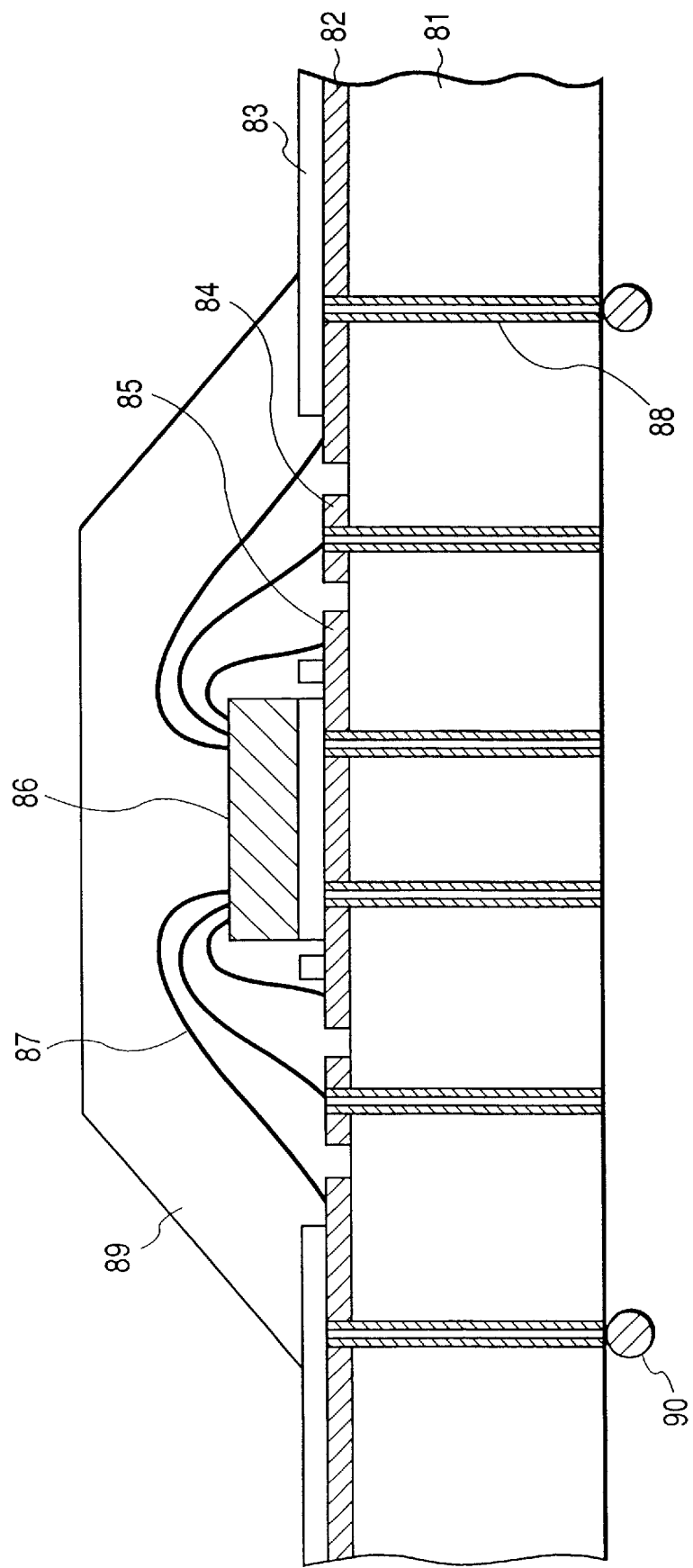
FIG. 8 is a schematic cross sectional view of a BGA package.

FIG. 8 is a schematic cross sectional view of an OMPAC (over molded pad array carrier) type BGA package. Necessary grounding wires 85, power wires 84, signal wires 82 are provided for semiconductor chip 86 by patterning on the front surface side of glass epoxy substrate 81 operating as circuit board for the BGA and connected to the semiconductor chip 86 by wire bonding using Au wires 87. The conductor circuit pattern is produced by means of a photolithographic technique normally used for patterning conductor circuits after boring ordinary through holes 88 in the glass epoxy substrate 81 that is coated on the opposite sides with a copper foil and plating the wall surface of the through holes 88 by means of a through hole plating technique. Solder resist is formed on the conductor circuits on the front and rear surfaces and the conductor circuit on the front surface is electrically connected to the conductor circuit on the rear surface by way of the through holes 88. Solder resist is generally used to protect circuits against heat and corrosion that can be brought forth as a result of solder plating in a process of electrically connecting electronic parts and a circuit board by using solder. In recent years, solder resist is also used for solder resist dams to solve the bridging problem that can arise when electrodes are arranged at a high pitch. The solder resist formed on the front surface side of a BGA substrate are used to limit the gold-plated area provided for wire bonding for the purpose of cost reduction and improve the moisture resistance of the highly hygroscopic material of the substrate and the chemical stability of the conductor circuits made of copper. Conventionally, solder resist is selected as a type of photoresist to be used to form a pattern by utilizing the chemical reaction that takes place in areas of the resist exposed to irradiation of light from the viewpoint of resolution, coating performance and the capabilities of meeting the above identified requirements. Generally, a dual solution photo-curing type material containing an unsaturated resin that has carboxylic acid in the molecule and a polyepoxy compound is used for solder resist. Resist is applied to a substrate carrying thereon a circuit pattern of a conductor, which substrate is then irradiated with light with an intensity sufficient to make the resist react to light, using a negative type photomask to cover necessary areas. Then, the unexposed areas of the resist is dissolved into and removed by an alkaline developing solution such as aqueous solution of sodium carbonate to produce a pattern. Subsequently, the cured coat is heated to cause the carboxyl group and the epoxy group to react each other in order to improve the bridging effect and make itself become highly resistant against heat and chemicals by transforming the carboxyl group that is an ion forming group into an ester group. In the case of a BGA package, solder resist of the type as described above is applied to the entire surface of the substrate 81 to a thickness of about 60 $\mu$m after forming a desired conductor circuit pattern on both of the front and rear surfaces of the substrate 81 as shown in FIG. 8. Then, the solder resist 83 is removed from the semiconductor chip to be mounted on the substrate for the areas to be used for wire bonding by means of a patterning operation, using the above described photolithograpic technique, also as shown in FIG. 8. Thereafter, the conductor circuits from which the solder resist has been partly removed are plated with Ni/Au and then the semiconductor chip 86 is mounted on the substrate and connected to the related electrodes ( 82, 84, 85 ) typically by way of Au wires 87 by means of wire bonding. Under this condition, sealing resin is poured into a mold by way of the electrodes to form a sealing resin layer 89 that hermetically seal the semiconductor chip. A sealing material that can be used for the purpose of the invention typically contains epoxy resin, a curing agent (e.g., phenol-novolak resin), an inorganic bulking agent (silica) and various additives. The use of a material that is less liable to warp is required for the sealing because the BGA package is sealed only at the upper side of the substrate. The use of an epoxy material that can accommodate the tendency of reducing the expansion coefficient and raising the Tg value (because of the cooling and the contraction that take place in the glass region after the molding) is recommended.

In the sealing process, sealing resin 89 is laid on the solder resist 83 in areas other than the areas occupied by the electrodes (not shown) and used as gates for pouring the sealing resin. In the operation of patterning the solder resist, the resist is removed from the areas between the site where the semiconductor chip is mounted and the grounding wires, the areas between the grounding wires and the power wires, the areas between the power wires and the signal wires and the areas between the signal wires, although the solder resist may be left in areas other than those between the signal wires.

Figure 9:
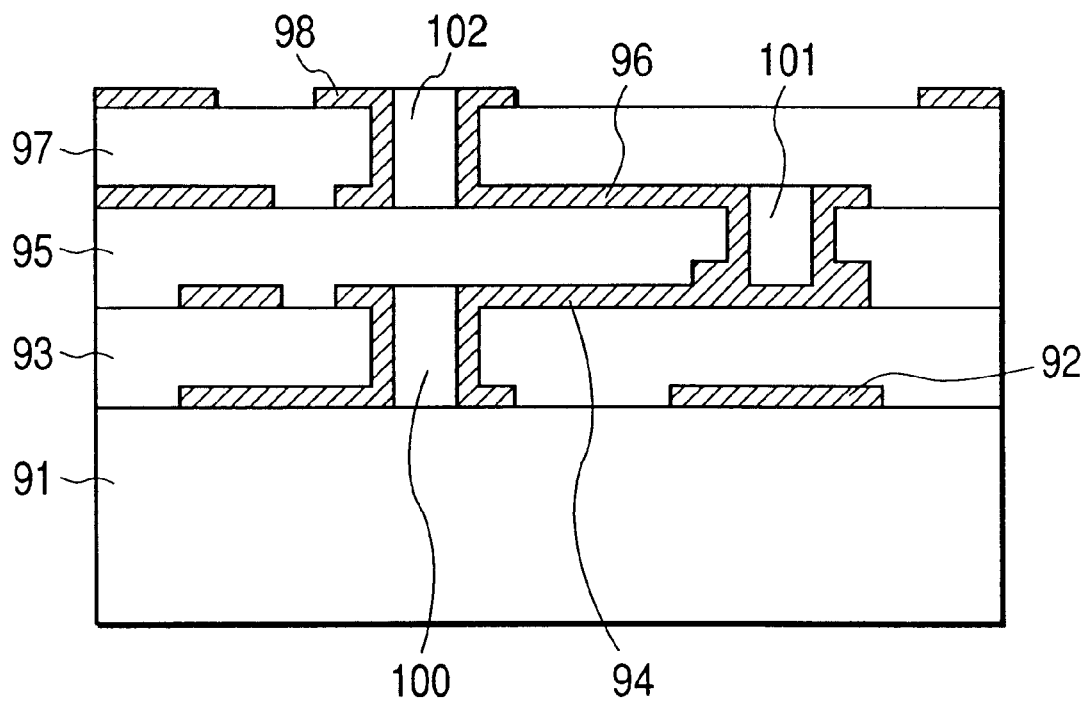
FIG. 9 is a schematic cross sectional view of a multilayer printed circuit board.

Referring to FIG. 9, a multilayer circuit board prepared by a build-up technique comprises a core substrate 91 made of an organic material. The core substrate may well be an insulator substrate or comprise rigid plates arranged on the opposite surfaces thereof or into a multilayer structure. The first circuit pattern 92 and the second circuit pattern 94 on the core substrate 91 are connected to each other by way of the first viahole 100 formed in the first insulation layer 93 and containing an insulator material buried therein, while the second circuit pattern 94 and the third circuit pattern 96 are connected to each other by way of the second viahole 101 formed in the second insulation layer 95 and containing an insulator material buried therein.

The technique for forming openings in the solder resist of a semiconductor package substrate and viaholes in a multilayer circuit board by means of a build-up process is currently shifting from the photo-via method based on photolithograpy to the laser-via method using laser, as the processing dimension reduces. The laser that can be used for the laser-via method may be $CO_2$ laser, YAG laser, higher harmonics of YAG laser or excimer laser. Japanese Patent Applications Laid-Open Nos. 5-136650, 5-152744 and 5-152748 disclose techniques for applying excimer laser to producing circuits on a printed circuit board. On the other hand, J. M. Morrison "A large format modified TEA $CO_2$ laser based process for cost effective via generation" (1994 International Conference on Multi-chip Modules, Apr. 13 to 15, 1994, p.369) describes application of impact laser obtained by improving $CO_2$ laser. M. Owen "New laser technology for drilling through-and blind-vias in copper clad resin forced circuit boards" (Proc. IPC Technical Conference, Apr. 30 to May 4, 1995, p. 19-1-1 through p. 19-1-20) describes application of YAG laser.

Now, the present invention will be described in greater detail by referring to an exemplary substrate. A copper thin film is formed to a thickness of about 20 $\mu$m on a glass epoxy resin substrate to be used as BGA substrate. A resist film of a negative or positive type photosensing resin is laminated on the copper thin film and bonded to the latter by thermocompression. If the resist film is of the negative type, the resist pattern is photo-cured, using a mask pattern having openings for forming a desired conductor pattern and subsequently the unexposed areas are dissolved and removed typically by means of a copper (II) chloride solution to produce the desired conductor pattern after etching the copper by means of iron (II) chloride that operates well as copper etchant. Then, through holes are bored at desired locations to a diameter of $\phi 0.3$ mm and the surface thereof is treated by means of an aqueous solution of an alkali metal compound or an acid before plating the through holes by means of a nonelectrolytic plating technique. After burying the through holes, the substrate is subjected to a blackening process. For the blackening process, a chemical treatment process can be used to improve the adhesion of the underlying wiring layer and the insulation layer of an organic resin material formed thereon. For example, an aqueous solution of sodium chlorite or that of potassium persulfate may be used for the chemical treatment. Then, solder resist made of a dual solution photo-curing type material containing an unsaturated resin that has carboxyl acid in the molecule and a polyepoxy compound is evenly formed typically by screen printing and pre-baked at temperature about 80° C. The process may include a step of mechanically polishing the surface of the conductor to remove the oxide film on the surface in order to improve the adhesion of the conductor pattern of copper and the solder resist. The solder resist layer is made to show openings by irradiating it with laser at locations corresponding to a ball grid to be formed there so that the ball grid may be arranged properly in position. The laser that can be used for the laser-via method may be $CO_2$ laser, YAG laser, the second harmonic, the third harmonic or the fourth harmonic of YAG laser or excimer laser, although the use of $CO_2$ laser is a recommendable choice because of its high processing speed. Laser irradiation will be conducted either by exposing the solder resist to laser as a whole or by scanning it with a laser beam.

Figure 10:
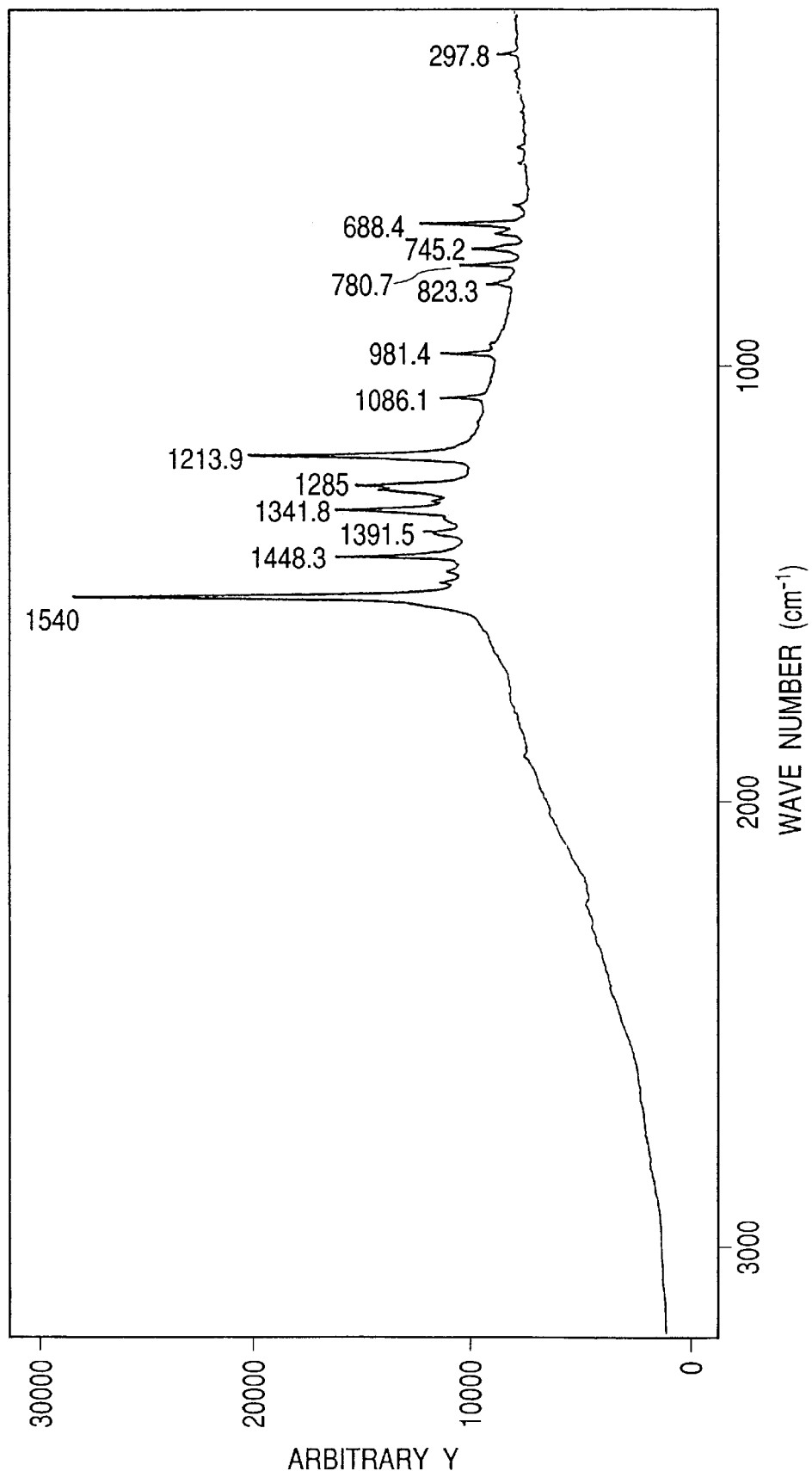
FIGS. 10, 11 and 12 are graphs showing Raman spectrograms.

The solder resist removed from the openings by the laser irradiation is analyzed by microscopic Raman spectrometry. Laser processes and analysis using Raman spectrometry are discussed in M. Ohmori et al. "Decomposition and Removal of Polyimide by Excimer Laser" (Society of Electricity, documents of Optical/Quantum Device Research Institute, OQD-89-55). The observation using laser may be conducted under the following conditions. HeNe laser (632.8 nm) with an output power of 0.6 mW, an integrating time of 700 seconds and a laser beam diameter of $\phi 1$ $\mu$m may be used with a spectroscope having a slit width of 100 $\mu$m. FIG. 10 shows a Raman spectrogram obtained for the solder resist. Some of the principal assignments of the observed Raman bands are listed in Table 1 below.

TABLE 1

| wave number (cm$^{-1}$) | expected assignment |
| --- | --- |
| 1540 | C=C stretching vibration |
|  | C—C stretching vibration |
| 1450 | C=C stretching vibration |
|  | C—C stretching vibration |
|  | C—H deformation vibration |
| 1340 | C—N stretching vibration |
| 1295, 1285 | CH$_2$ torsional vibration |
| 1215 | C-$\phi$ stretching vibration |
|  | C—O stretching vibration |
| 1080 | C—H deformation vibration |
| 980 | C=C stretching vibration |

Figure 11:
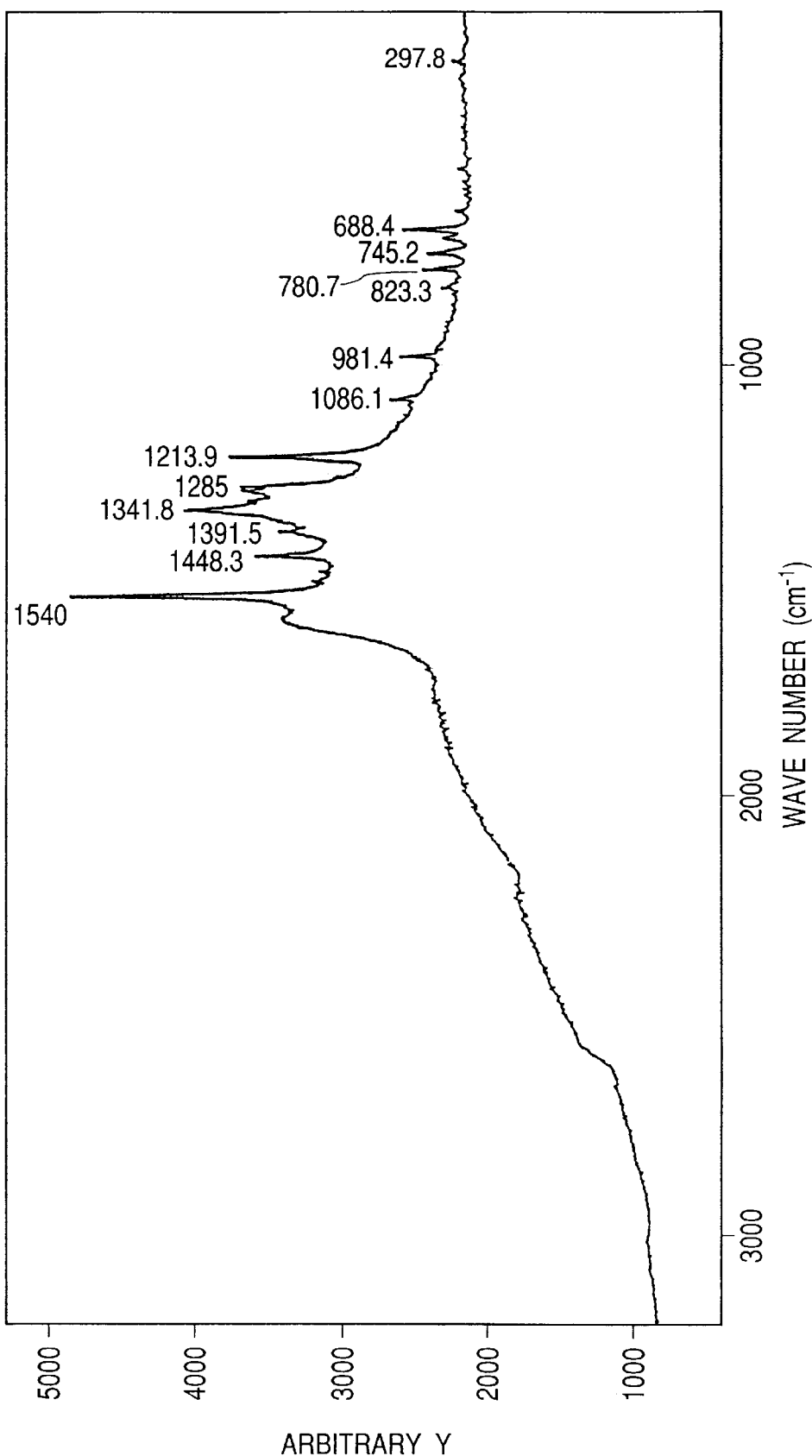
Figure 12:
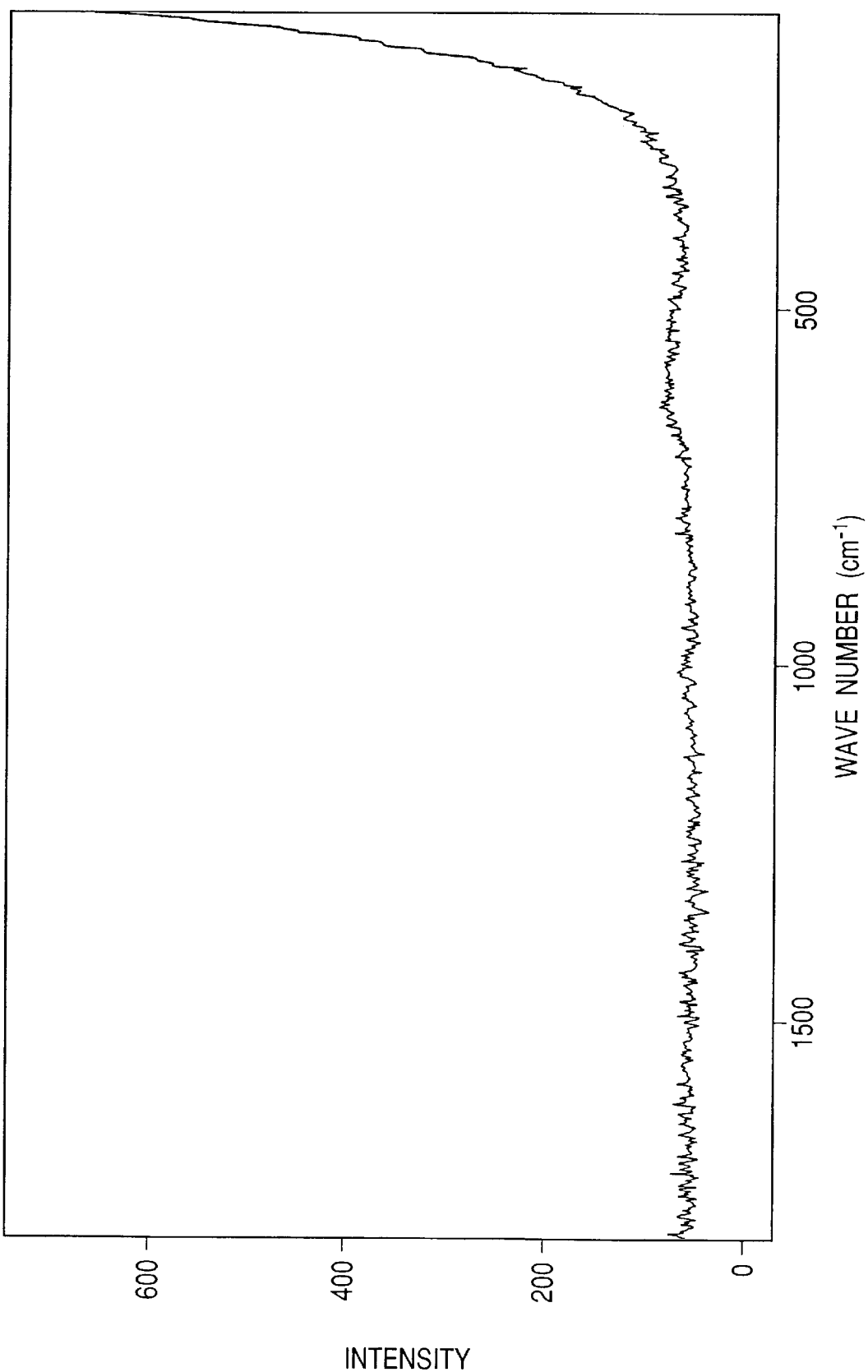

The observed Raman spectrum corresponds to the material of the solder resist. FIG. 11 shows a Raman spectrogram obtained for the lower electrode section after a laser process conducted without any blackening operation. It will be seen that a Raman band corresponding to the solder resist of FIG. 10 can be observed and, at the same time, a Raman band assigned to the C=C stretching vibration of amorphous carbon is observable near the wave number of 1600 cm$^{-1}$. Any attempt for Ni/Au plating will result in a total failure under this condition. On the other hand, FIG. 12 shows a Raman spectrogram obtained when a blackening operation is conducted and the blackened surface is subjected to a soft etching process after producing openings by means of $CO_2$ laser. As a result, no Raman spectrum of solder resist nor Raman band assigned to the C=C stretching vibration of amorphous carbon as shown in FIGS. 10 and 11 will be observed to indicate that neither solder resist nor amorphous carbon exist there. Thus, an excellent plate will be produced as a result of an Ni/Au plating operation conducted under this condition.

Any residue in the processed areas including debris of amorphous carbon in particular can be detected by applying the Raman spectrography to the laser-processed areas of the substrate to predict the success or failure of the subsequent plating process. Additionally, if debris of solder resist are not removed completely and remain, if partly, in the processed areas, it is likely that no plate is formed there or, if formed, the produced plate is short of reliability in terms of electric as well as mechanical connection depending on the volume of the solder resist residue.

The effect of blackening the surface of copper wires or arranging a light absorbing layer probably lies in that, if the laser beam is absorbed by the material of the insulation layer in an ordinary laser process using $CO_2$ laser with a wavelength of $\lambda$=10.06 $\mu$m, a standing wave will be formed by the incident light and the light reflected by the copper surface and the copper surface will operate as a node of the standing wave because copper has a reflectivity of about 99% relative to the laser beam. Thus, the intensity of the electric field near the copper surface will be substantially equal to zero so that the material of the insulation layer is presumably left as residual debris on and near the copper surface. If, on the other hand, the copper surface is blackened or a light absorbing layer is arranged there, the reflectivity of the copper surface relative to the laser beam will be reduced and hence light will be absorbed by the blackened copper surface or by the light absorbing layer to consequently raise the intensity of the electric field at the copper surface and eliminate the possible residues of the insulation layer. If the residues are not completely removed, needle-like copper oxide is found in the blackened area so that the blackened area can easily be reduced and removed by the soft etching process to be conducted prior to the plating process to produce a copper surface free from any residual debris of the organic resin material and/or amorphous carbon. Thus, the openings (ball grid section) of the solder resist produced by a laser via technique can be plated with an enhanced reliability for electric connection. A similar result could be obtained for a multilayer circuit board prepared by a build-up technique. Thus, in the process of forming a solder resist pattern or one or more than one viaholes for interlayer connection by irradiation of a laser beam in a circuit board adapted to be used for connecting one or more than one BGA packages or as a multilayer circuit board prepared by means of a build-up technique and plating the openings for electric connection, it is possible by blackening in advance the surface of the copper circuits located under the organic insulator to be removed by the laser beam irradiation to make the surface of the copper circuit free from undesired objects including residual debris of organic resin materials such as solder resist and amorphous carbon that can be produced by the laser beam irradiation. Then, a highly reliable electric connection will be realized by the subsequent plating operation to raise the yield of the plating operation.

Embodiment 1

A first embodiment of the invention will be described by referring to FIGS. 13A through 13D, in which there are shown an insulator 1, copper foils 2, 3 a metal thin film 9 that is apt to absorb laser beams to become destructed easily, a window 5 for a blind hole produced by cutting through the outer copper foil 2 by photolithograpy. Reference numeral 10 denotes a hole cut by a laser beam to form an electro-conductive layer.

Figure 13A:
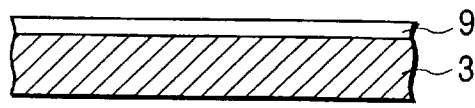
FIGS. 13A, 13B, 13C and 13D are schematic cross sectional views of a circuit board, showing different manufacturing steps.

For preparing a printed circuit board having the illustrated configuration, in which a hole is to be cut by laser, firstly a metal thin film 9 that is apt to absorb laser beams and become decomposed is formed on a copper foil 3 as shown in FIG. 13A. Techniques that can be used for forming the thin film include, not limitatively, vapor deposition, plating and dipping. It is better for the thickness of the film to be as small as possible because a very thin film can evaporate instantaneously with little energy, although the film thickness is preferably between 1 and 2 $\mu$m.

Any material that absorbs laser beams to become decomposed with ease can be used for the thin film. Preferable materials that can be used for the thin film include solder and other Sn alloys.

Figure 13B:
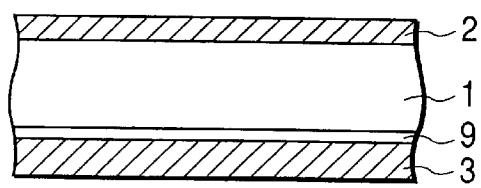
Figure 13C:
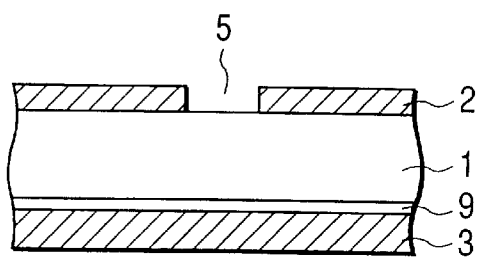
Figure 13D:
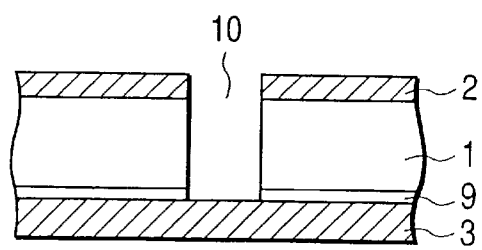

Then, as shown in FIG. 13B, the thin film 9 formed on the copper foil 3 is bonded to an insulator 1. Another copper foil 2 is bonded to the opposite side of the insulator 1. Then, the two copper foils are subjected to a patterning operation and a window 5 is cut through the outer copper foil 2 of the printed circuit board as shown in FIG. 13C. Then, as shown in FIG. 13D, a laser beam is irradiated onto the printed circuit board through the window 5 to simultaneously remove the insulator 1 and the metal thin film 9 sandwiched by the outer copper foil 2 and the inner copper foil 3 in order to produce a blind hole 10 and expose the surface of the copper foil 3 that is free from any carbide layer.

In an experiment for forming a printed circuit board having a configuration as described above and carrying a 1 $\mu$m thick metal thin film 9 produced by vapor deposition of solder, the window 5 having a diameter of $\phi$0.2 mm and the insulator between the outer copper foil 2 and the inner copper foil 3 having a thickness of 0.1 mm, the circuit board was shot with a laser beam having an output power of 30 mj/p and a pulse width of 50 $\mu$s for five times to expose the surface of the copper foil, which was found to be free from any carbide layer.

Embodiment 2

A second embodiment will be described by referring to FIGS. 14A through 14D.

Figure 14A:
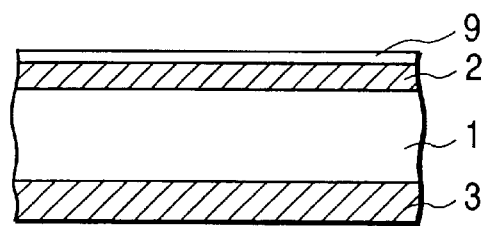
FIGS. 14A, 14B 14C and 14D are schematic cross sectional views of another circuit board, showing different manufacturing steps.

In FIGS. 14A through 14D, there are shown an insulator 1, copper foils 2, 3 and a metal thin film 9 that is apt to absorb laser beams to become destructed easily. For preparing a printed circuit board having the illustrated configuration, in which a hole is to be cut by laser, firstly a thin film 9 is formed on one of the copper foils 2 and 3 arranged respectively on the opposite sides of the insulator 1, or the copper foil 2, as shown in FIG. 14A. Techniques that can be used for forming the thin film include, not limitatively, vapor deposition, plating and dipping. Any material that absorbs laser beams to become decomposed with ease can be used for the thin film. Preferable materials that can be used for the thin film include solder and other Sn alloys.

Figure 14B:
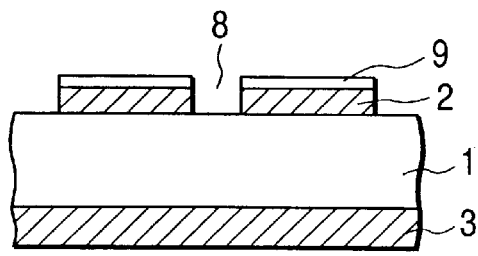
Figure 14C:
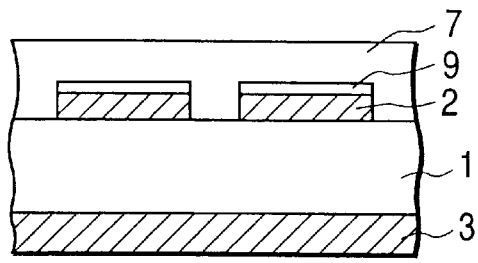
Figure 14D:
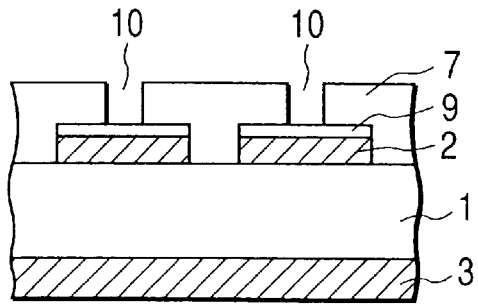

Then, as shown in FIG. 14B, the copper foil 2 is subjected to a patterning operation with the thin film 9. Reference numeral 8 denotes an etched portion. FIG. 14C shows an insulation layer 7 formed by applying solder resist onto the surface of the patterned circuit board. Then, a laser beam is irradiated onto the printed circuit board at a desired spot to simultaneously remove the insulation layer 7 and the metal thin film 9 in order to produce blind holes 10 and expose the surface of the copper foil that is free from any carbide layer (FIG. 14D).

In an experiment for forming a printed circuit board having a configuration as described above and carrying a 1 $\mu$m thick metal thin film 9 produced by vapor deposition of solder, the circuit board was shot with a laser beam having an output power of 12 mj/p and a pulse width of 25 $\mu$s for five times in the atmosphere to produce blind holes with a diameter of $\phi$0.3 mm cut through a 30 $\mu$m thick insulation layer and expose the surface of the copper foil, which was found to be free from any carbide layer.

Embodiment 3

Figure 15:
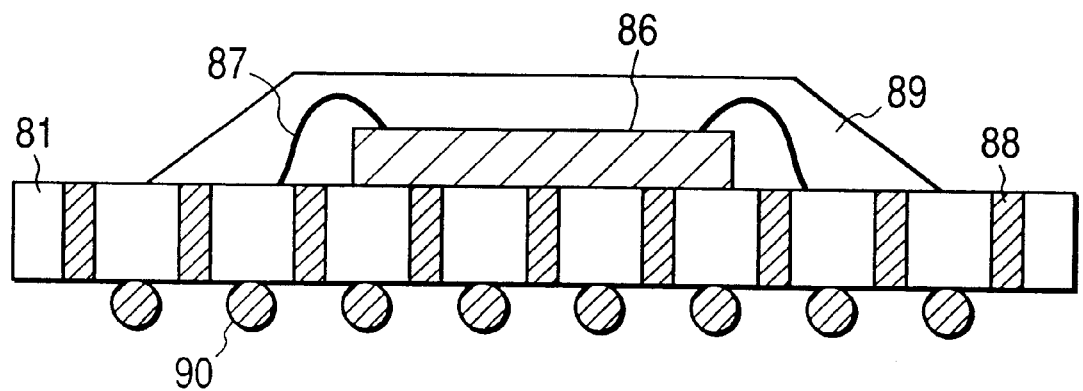
FIG. 15 is a schematic cross sectional view of a BGA package different from that of FIG. 8.

FIG. 15 is a schematic cross sectional view of a BGA package. In an experiment, a glass epoxy substrate carrying on each of the opposite sides a 18 $\mu$m thick copper foil was used. Through holes 88 having a diameter of $\phi$0.3 mm were bored through the substrate at desired positions by means of a drill or a $CO_2$ laser beam and the surface was treated with an aqueous solution of an alkali metal compound or acid before forming a 15 $\mu$m thick copper film by means of nonelectrolytic plating. Then, a resist film of a negative type photosensing resin was laminated on the copper thin film and bonded thereto by thermal compression. After photo-curing the resist film, using a mask pattern having a desired conductor pattern, all the unexposed portions of the film were dissolved and removed by means of a copper (II) chloride solution and a desired conductor pattern was obtained by etching the copper by means of iron (II) chloride, which operated as copper etchant. Then, the copper wires were dipped into an aqueous solution of NaOH:20 g/liter, $Na_2PO_4 \cdot 12H_2O$:15 g/liter and $NaClO_2$:42 g/liter for five minutes for the purpose of blackening.

Figure 16:
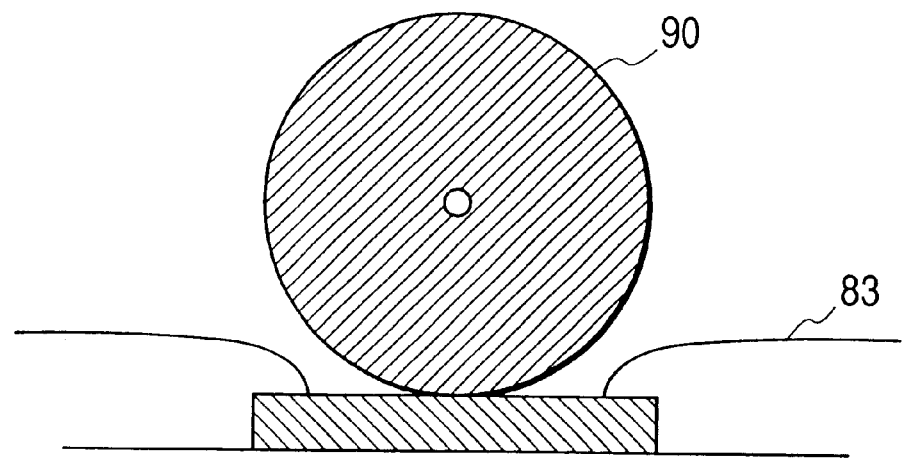
FIG. 16 is a schematic cross sectional view a solder ball arranged on a substrate.

Subsequently, a uniform solder resist layer 83 of a dual solution photo-curing type material containing as principal ingredients an unsaturated resin that has carboxylic acid in the molecule and a polyepoxy compound was evenly formed to a thickness of 60 $\mu$m (but only 27 $\mu$m on the conductor pattern) by screen printing and pre-baked at about 80° C. Then, the solder resist was shot twice by a laser beam at positions corresponding to the ball grid as shown in FIG. 16 by means of a $CO_2$ laser system (not shown) with a pulse width of 20 $\mu$s and a repetition frequency of 300 Hz, after regulating the optical system thereof to show an energy density of 35 J/cm$^2$ and a beam profile of 30*30 mm. It was confirmed through an SEM (scanning electronic microscope) that a hole had been bored with a diameter of $\phi$200 $\mu$m at each of the positions under the above conditions. Then, the conductor electrodes from which the solder resist had been removed were plated with Ni/Au. After mounting a semiconductor chip 86 on the BGA substrate and bonding them together, the grounding electrodes, the power electrodes and the signal electrodes were connected by Au wires by means of wire bonding. Thereafter, sealing resin was poured into the mold through the gate sections formed on the surface of the substrate. Sealing resin was a thermo-curing epoxy resin containing powdery silica as bulking agent and phenolnovolak resin as curing agent and poured into the mold by making use of the capillary phenomenon until the mold was filled with sealing resin. The mold was satisfactorily filled with resin as the substrate 81 was heated to about 60 to 80° C to reduce the viscosity of the sealing resin. Then, the filled resin was cured by way of a stepped curing process of 100° C./4 hrs and 150° C./2 hrs. Thereafter, solder ball bumps were formed on the predetermined positions of the ball grid by means of a known technique. While the through holes 88 and the corresponding ball bumps 90 appear to be displaced from each other in FIG. 15, it is not necessary to be so and the positional arrangement as shown in FIG. 8 is also feasible for the purpose of the invention. However, from the viewpoint of blackening effect, ball bumps are preferably arranged on the electrodes formed on the surface of the substrate (base) 81.

The BGA specimens prepared by way of the above described process were then evaluated for the quality in a manner as described below. For each specimen, the warp of the package was observed after the packaging operation in terms of the largest displacement from the plane area of the surface of the package. The warp was found to be 40 μm, which does not give rise to any problem. Then, the rate of producing cracks was tested, leaving the devices in an atmosphere with temperature of 85° C. and a relative humidity of 85% for 150 hours to make the devices absorb moisture and subsequently dipping them in a solder bath at 240° C. for 30 seconds to find that the rate of producing cracks was 0/30 to prove that the devices had a satisfactory solder resistance. As an impact resistance test, the devices were subjected to 500 cooling/heating cycles (TCT test), where they cyclically experienced −65° C., room temperature and 150° C., and examined for the performance to find that the rate of producing defective devices was 0/30. Finally, the reliability of moisture resistance was tested by subjecting the specimens to a pressure cooker test (PCT), where they were left in a saturated steam pressure atmosphere of 2.5 atm. at 127° C. for 500 hours to find that the rate of producing leak/open defects was 0/30. Thus, it was proved that the obtained BGA devices were highly reliably.

Comparative Embodiment 1

Openings were formed in the solder resist on a BGA substrate by means of laser as in Embodiment 1 without subjecting it to blackening process. After an Ni/Au plating process conducted as in Embodiment 3, it was found that no plate had been formed in the openings.

Embodiment 4

Openings were formed in the solder resist on a BGA substrate to a diameter of φ150 μm as in Embodiment 3, although only the $CO_2$ laser was replaced sequentially by the fundamental wave, the second harmonic, the third harmonic and the fourth harmonic of YAG laser as listed in Table 2 below. Then, an Ni/Au plating process was conducted in a conventional manner to find that the processed surface had been plated satisfactorily with any of the fundamental wave, the second harmonic, the third harmonic and the fourth harmonic of YAG laser.

TABLE 2

| laser | wave length (μm) | energy density (J/cm²) | irradiation conditions | depth of removal (μm) |
|---|---|---|---|---|
| YAG fundamental wave | 1.064 | 4.5 | φ150 μm pulse width: 75 ns repetition frequency: 2 kHz power density: 1 × 10⁷ W/mm² | 30 |

TABLE 2-continued

| laser | wave length (μm) | energy density (J/cm²) | irradiation conditions | depth of removal (μm) |
|---|---|---|---|---|
| YAG second harmonic | 0.532 | 4.5 | φ150 μm pulse width: 75 ns repetition frequency: 2 kHz power density: 1 × 10⁷ W/mm² | 30 |
| YAG third harmonic | 0.355 | 4.2 | φ150 μm pulse width: 40 ns repetition frequency: 2 kHz power density: 2 × 10⁷ W/mm² | 30 |
| YAG fourth harmonic | 0.266 | 4.0 | φ150 μm pulse width: 45 ns repetition frequency: 2 kHz power density: 2 × 10⁷ W/mm² | 30 |

Then, BGA packages were prepared as in Embodiment 3 and the obtained specimens were tested as in Embodiment 3 to obtain satisfactory results.

Embodiment 5

Openings were formed in the solder resist on a BGA substrate to a diameter of φ150 μm and the solder resist was removed from the openings as in Embodiment 3, although only the $CO_2$ laser was replaced sequentially by ArF, KrF and XeCl of excimer laser as listed in Table 3 below. Then, an Ni/Au plating process was conducted in a conventional manner to find that the processed surface had been plated satisfactorily with any of the above irradiations.

Then, BGA packages were prepared as in Embodiment 3 and the obtained specimens were tested as in Embodiment 3 to obtain satisfactory results.

TABLE 3

| laser | wave length (μm) | energy density (J/cm²) | irradiation conditions | depth of removal (μm) |
|---|---|---|---|---|
| XeCl | 0.308 | 4.0 | φ100 μm pulse width: 20 ns repetition frequency: 1 kHz power density: 5 × 10⁷ W/mm² | 30 |
| KrF | 0.248 | 4.0 | φ100 μm pulse width: 20 ns repetition frequency: 1 kHz power density: 5 × 10⁷ W/mm² | 30 |
| ArF | 0.193 | 4.0 | φ100 μm pulse width: 20 ns repetition frequency: 1 kHz power density: 5 × 10⁸ W/mm² | 30 |

Embodiment 6

Figure 17A:
FIGS. 17A, 17B, 17C, 17D, 17E and 17F are schematic cross sectional view of still another circuit board, showing different manufacturing steps.
Figure 17B:
Figure 17C:
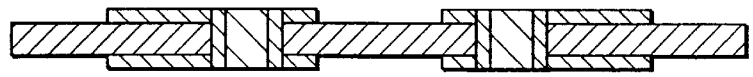
Figure 17D:
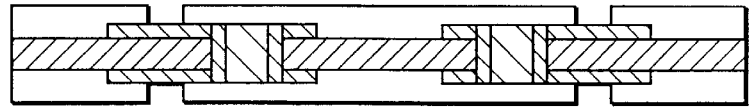
Figure 17E:
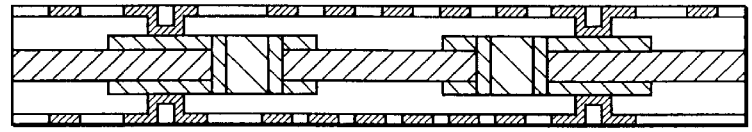
Figure 17F:
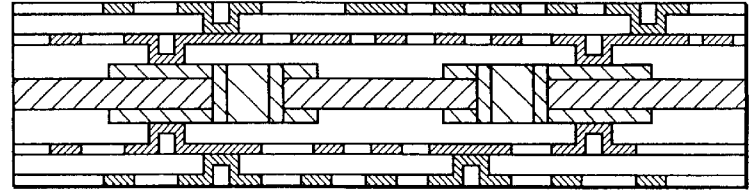

A multilayer circuit board was prepared by a build-up technique using a core substrate comprising a laminate substrate having an insulation layer containing epoxy resin as resin component and aramid fibers for reinforcement, to which a 18 μm thick copper foil had been applied to the front and rear surfaces as first and second electroconductive layers. Then, the wall surfaces of the through holes of the core substrate were made electrically conductive (FIGS. 17A and 17B). Photosensitive resist was applied to or laminated on the copper foils on the core substrate and the mask film was firmly bonded to the substrate before it was exposed to light and photochemically developed to produce a circuit pattern (FIG. 17C). The core substrate now carrying a circuit pattern was then subjected to a blackening process as in Embodiment 3. Subsequently, an insulation layer of non-photosensing epoxy resin was formed by application to a thickness of 50 μm. Then, via holes were bored through by means of $CO_2$ laser as in the case of Embodiment 3 (FIG. 17D) with a pulse width of 20 μs, a repetition frequency of 300 Hz, an energy density of 35 $J/cm^2$, a beam profile of 30*30 mm and a pulse number of 3 shots. The inside of the produced viaholes was cleared of copper oxide by reducing the latter by means of etching. After cleaning the device, the surface of the insulation layer was roughened by means of a solution containing an oxidizing agent to produce fine anchors with a size of several micrometers. Then, a palladium catalyst was arranged on the entire surface and the photosensing resist to be used for nonelectrolytic plating was exposed to light and photochemically developed to make it operate as permanent resist before forming conductor circuits with L/S=50 μm/50 μm by nonelectrolytic plating (FIG. 17E). The above steps were repeated on the opposite sides of the core substrate to produce a built-up multilayer circuit board (FIG. 17F). As a result of testing the multilayer circuit board for evaluation, it was confirmed that the multilayer circuit board was of a satisfactorily high quality.

As described above in detail, with a process of forming blind holes through a layer or an electroconductive layer such as copper foils by laser radiation according to the invention, holes can be bored satisfactorily without leaving any resin carbides such as amorphous carbon on the inner copper foil by providing a light absorbing layer typically of metal or by blackening the conductor.

Additionally, according to the invention, the reliability of the electric connection of plated viaholes can be significantly improved. Finally, according to the invention, high density and high reliability BGA circuit boards and multilayer circuit boards to be prepared by a build-up technique can be manufactured at a high yield.

What is claimed is:

1. A circuit board comprising an insulator arranged on a conductor and adapted to be used after exposing a portion of the conductor under the insulator by irradiating a laser beam on the insulator and subsequently etching and then plating the exposed portion of the conductor so that a wiring can be electrically connected to the exposed portion of the conductor, wherein a laser beam absorbing region, which is a thin film of an alloy material containing Sn, is provided between the conductor and the insulator.

2. A circuit board according to claim 1, wherein the laser beam absorbing region is a thin film apt to be decomposed by absorbing a laser beam.

3. A circuit board according to claim 1, wherein the insulator contains organic resin.

4. A circuit board according to claim 3, wherein the organic resin contains either solder resist or photosensing resin.

5. A circuit board comprising an insulator having first and second surfaces opposite to each other and first and second copper foils arranged on the first and second surfaces respectively, the first copper foil being partly removed to expose the insulator at spots corresponding to one or more than one blind holes to be bored to the second copper foil through the insulator by irradiating a laser beam on the exposed portions, wherein a thin film made of solder or an Sn alloy material and apt to be decomposed by absorbing a laser beam is provided between said insulator and said second copper foil.

6. A circuit board comprising a copper foil for forming a copper foil of circuits having a surface to which an insulation layer is applied, said circuit board being adapted to produce at least one blind hole to the surface of the copper foil under the insulation layer by irradiating a laser beam and partly removing the insulation layer, wherein a layer region capable of absorbing and being decomposed by the laser beam is provided on the copper foil so that the irradiated portion of said layer region can be removed while leaving the copper foil to provide a wiring electrically connected to the copper foil under the removed portion of the layer region.

7. A circuit board according to claim 6, wherein the layer region comprises solder or an Sn alloy material.

8. A circuit board according to claim 6, wherein said layer region is formed by a blackening treatment of the copper foil.

* * * * *

UNITED STATES PATENT AND TRADEMARK OFFICE
CERTIFICATE OF CORRECTION

PATENT NO. : 6,346,678 B1
DATED : February 12, 2002
INVENTOR(S) : Hiroshi Kono et al.

It is certified that error appears in the above-identified patent and that said Letters Patent is hereby corrected as shown below:

Column 2,
Line 24, "cross sectional" should read -- cross-sectional --; and
Line 50, "above mentioned" should read -- above-mentioned --.

Column 3,
Line 21, "above described" should read -- above-described --; and
Line 23, "above identified" should read -- above-identified --.

Column 4,
Line 10, "cross sectional" should read -- cross-sectional --;
Line 14, "cross sectional" should read -- cross-sectional --;
Line 18, "cross sectional" should read -- cross-sectional --;
Line 20, "cross sectional" should read -- cross-sectional --;
Line 24, "cross" should read -- cross --;
Line 27, "14B 14C" should read -- 14B, 14C --; and "cross sec-" should read -- cross-sec- --;
Line 31, "cross sectional" should read -- cross-sectional --;
Line 33, "cross sectional" should read -- cross-sectional --; and
Line 36, "cross sectional view" should read -- cross-sectional views --;

Column 5,
Line 9, "cross sectional" should read -- cross-sectional --;
Line 27, "brought forth" should read -- produced --;
Line 42, "above identified" should read -- above-identified --;
Line 51, "is" should read -- are --;
Line 54, "react" should read -- react with --; and
Line 66, "above described photolithographic" should read -- above-described photolithographic --.

Column 6,
Line 6, "seal" should read -- seals --; and
Line 46, "photolithograpy" should read -- photolithography --.

UNITED STATES PATENT AND TRADEMARK OFFICE
CERTIFICATE OF CORRECTION

PATENT NO. : 6,346,678 B1
DATED : February 12, 2002
INVENTOR(S) : Hiroshi Kono et al.

It is certified that error appears in the above-identified patent and that said Letters Patent is hereby corrected as shown below:

<u>Column 9,</u>
Line 9, "3 a" should read -- 3, a --; and
Line 12, "photolithograpy." should read -- photolithography. --.

<u>Column 10,</u>
Line 21, "cross sectional" should read -- cross-sectional --; and
Line 37, "reliably." should read -- reliable. --.

Signed and Sealed this

Eighteenth Day of June, 2002

Attest:

Attesting Officer

JAMES E. ROGAN
*Director of the United States Patent and Trademark Office*